United States Patent [19]
Willingham et al.

[11] 3,965,444
[45] June 22, 1976

[54] TEMPERATURE COMPENSATED SURFACE ACOUSTIC WAVE DEVICES

[75] Inventors: Charles B. Willingham; Thomas E. Parker, both of Framingham; Frank H. Spooner, Concord, all of Mass.

[73] Assignee: Raytheon Company, Lexington, Mass.

[22] Filed: Jan. 3, 1975

[21] Appl. No.: 538,478

[52] U.S. Cl. .............................. 333/30 R; 310/8.2; 310/9.5; 310/9.8; 331/107 A; 331/155; 333/72
[51] Int. Cl.² .................... H03H 9/26; H03H 9/30; H03B 5/32; H01L 41/18
[58] Field of Search ............. 333/72, 30 R; 310/8.1, 310/9.3, 9.8, 9.5, 8.2, 8.3; 331/107 A, 154, 155, 175, 187

[56] References Cited
UNITED STATES PATENTS

| | | | |
|---|---|---|---|
| 3,766,496 | 10/1973 | Whitehouse | 331/155 X |
| 3,786,373 | 1/1974 | Schulz et al. | 333/30 |
| 3,855,548 | 12/1974 | Nandi et al. | 333/107 A |

OTHER PUBLICATIONS
Weller et al., –"Optical Detection of Acoustic Surface Waves in Layered Substrates:" Theory and Experiment in IEEE Trans. on Sonics and Ultrasonics, vol. SU-21, No. 3, July 1974, pp. 196-203.

*Primary Examiner*—Alfred E. Smith
*Assistant Examiner*—Marvin Nussbaum
*Attorney, Agent, or Firm*—John R. Inge; Joseph D. Pannone; Milton D. Bartlett

[57] ABSTRACT

A temperature compensated surface acoustic wave device having an SiO₂ film layer upon a substrate of piezoelectric material. The positive temperature coefficient of delay of the piezoelectric substrate is counterbalanced by the negative temperature coefficient of the SiO₂ layer. The thickness and shape of the SiO₂ layer are chosen to give a zero first order temperature coefficient for the composite device. Lithium niobate and lithium tantalate are preferred piezoelectric materials for the substrate. A high degree of temperature stability is thereby obtained with coupling coefficients much greater than were previously obtained by prior temperature compensated surface acoustic wave devices.

39 Claims, 13 Drawing Figures

TEMPERATURE COMPENSATED SURFACE ACOUSTIC WAVE DEVICES

The invention herein described was made in the course of or under a contract or subcontract thereunder with the Department of Defense.

BACKGROUND OF THE INVENTION

1. Field of the Invention

The invention relates to surface acoustic wave devices and systems employing such devices having multiple layers of piezoelectric and nonpiezoelectric material, the object thereof being to achieve as nearly as possible a zero temperature coefficient of delay. The device also belongs to the class of surface acoustic wave devices having relatively high coupling between transducers and substrates making the device particularly useful in applications requiring broad band frequency response.

2. Description of the Prior Art

Surface acoustic wave devices have been employed in radar and communications systems for a decade or more. In their simplest form, a surface acoustic wave device comprises a substrate of piezoelectric material with two or more transducers arrayed on and coupled to the surface of the substrate. The transducers comprise interleaved sets of conductive fingers which launch and receive surface waves to and from the surface of the piezoelectric substrate.

The delay time of such a device is the time required for a surface wave to propagate from an input transducer to an output transducer. This quantity is critical in determining many operating characteristics of such devices. For example, in oscillator applications, the output frequency of the oscillator varies inversely with the change in delay time.

Due to a number of factors, the delay time of a surface acoustic wave device is a function of temperature. This function may be either a positive or negative function of temperature although the great majority of materials have a positive coefficient. The function is usually nonlinear because of the many different factors which contribute to the variation in delay time versus temperature. In mathematical terms a Taylor expansion can be made of the function of delay time versus temperature for any particular device or material. The first nonconstant term, that is the linear term of the Taylor series expansion, is called the first order temperature coefficient. The next term is called the second order temperature coefficient and represents the second degree variation of delay time of temperature.

ST-cut quartz disclosed and claimed in U.S. Pat. No. 3,818,382 to Holland et al. and assigned to the present assignee has a zero first order temperature coefficient at room temperature and a second order temperature coefficient of approximately $31 \times 10^{-9}/(°C)^2$. For many applications, the temperature coefficient of ST-cut quartz is sufficient. However, the coupling coefficient of ST-cut quartz is somewhat low. Larger coupling coefficients are desired in a number of applications where more bandwidth is required than can ordinarily be obtained using ST-cut quartz.

With materials having a larger coupling coefficient but also larger temperature coefficient than ST-cut quartz, other means were frequently required to attain sufficient temperature stabilization. A temperature controlled chamber or oven was frequently employed for this purpose. Of course, such systems were bulky, expensive, and could not be used in many applications such as in missile systems where the space and power connsumption of the oven could not be tolerated.

Surface acoustic wave devices having multiple layers of piezoelectric and nonpiezoelectric material were later developed. In one of these, disclosed and claimed in U.S. Pat. No. 3,786,373 to Schulz et al and assigned to the present assignee, a multiple layer device is shown wherein a piezoelectric layer of ZnO is deposited upon a nonpiezoelectric substrate which may be fused silica. Devices produced in accordance with that invention have solved many of the problems of the prior art. However, high quality ZnO layers have been found somewhat difficult to deposit and it is desired to find a somewhat less expensive means of solving the temperature coefficient problem.

SUMMARY OF THE INVENTION

Accordingly, it is an object of the present invention to provide a surface acoustic wave device that has temperature coefficient of delay within a predetermined range of values. The first order temperature coefficient is preferably zero.

It is also an object of the present invention to provide a surface acoustic wave device which is easy and inexpensive to fabricate yet has a low temperature coefficient of delay.

Moreover, it is an object of the present invention to provide a surface acoustic wave device which has high coupling coefficient, low temperature coefficient of delay, and which does not require temperature stabilization in an oven.

Furthermore, it is an object of the present invention to provide a surface acoustic wave device in which the first order temperature coefficient of the substrate is balanced with an equal and opposite first order temperature coefficient of an overlay material.

These, as well as other objects of the present invention, are met with the combination of means for providing a substrate of piezoelectric material and a layer of $SiO_2$ upon the substrate, the thickness of the $SiO_2$ layer being determined such that the temperature coefficient of delay of surface waves propagating along the surface of the substrate is minimized or the first order temperature coefficient is substantially zero. One or more transducer means may be coupled to the substrate to launch and receive surface waves.

Lithium tantalate and lithium niobate are the preferred materials for the substrate. In the case of lithium tantalate, a single layer of silicon dioxide having a uniform thickness of approximately one-half the wavelength of the surface waves is preferred. In the case of lithium niobate, it is preferred that the film thickness be varied so as to prevent the surface wave from being converted into bulk waves and the concurrent dissipation of energy thereby. In a surface wave device having a set of transducers located at each end of the device, the silicon dioxide layer has a preferred thickness of approximately 0.1 wavelength. The center portion of the oxide layer has a preferred thickness of 0.7 wavelengths tapering in the region where it joins the thinner layers. The center portion occupies approximately 55% of the linear distance between transducers.

The invention is used to advantage in combination with a number of different radar and communication systems. In a pulse compression radar system, tilted transducers are used wherein the spacing between fingers and length of fingers is varied so that the propagation time between transducers is varied as a function of the frequency of the input signals.

In a switchable filter or oscillator application, a plurality of transducers used spaced at predetermined distances from one another. The end transducers are terminated with the negative of their output reactance so as to be reflecting. The remaining transducers are selectively coupled to input and output circuitry thereby permitting only signals having predetermined frequencies to propagate between input and output circuits.

The invention is also used to advantage as a tapped delay line wherein signals are extracted at a number of points along the length of the piezoelectric substrate. The extracted signals can be recombined with appropriate weighting applied to each in a number of signal processing applications.

DESCRIPTION OF THE PREFERRED EMBODIMENTS

Figure 1:
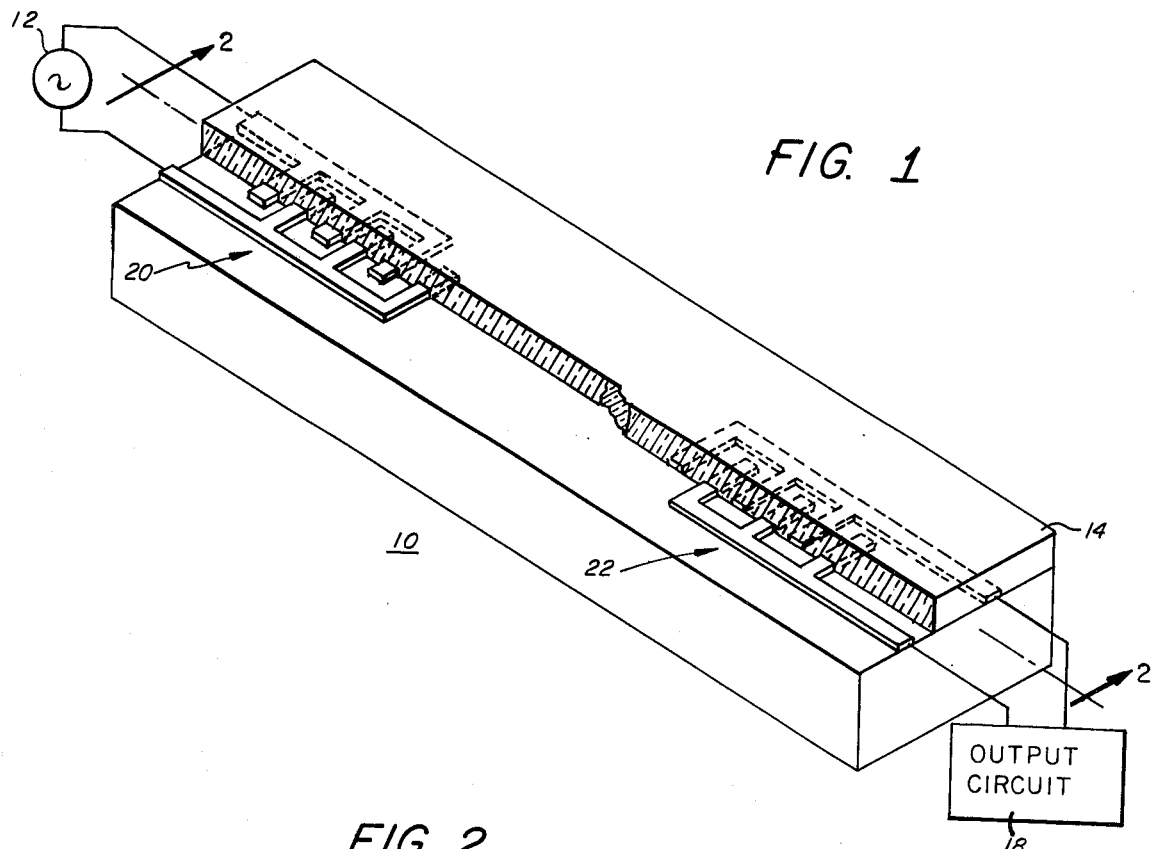
FIG. 1 is a partially cutaway view of a surface acoustic wave device embodying the present invention.

Referring now to FIG. 1, there is shown a partially cutaway perspective view of a surface acoustic wave device 10 constructed in accordance with the teachings of the present invention. A substrate 16 of piezoelectric material forms the base upon which the device is constructed. Its thickness is preferably many times the wavelength of acoustic waves traveling upon its surface. Signals applied from an input signal source 12 are converted from electrical to mechanical form by input transducer 20 and launched as surface waves along the surface of substrate 16 towards output transducer 22. Both input and output transducers 20 and 22 are constructed of interleaved conductive fingers, the length of which and the spacing between fingers being determined by the frequency and bandwidth of the input signals. The preferred piezoelectric materials for substrate 16 are YZ-cut lithium niobate and YZ-cut lithium tantalate. These materials are preferred for their excellent coupling coefficients between transducers and the surface of the substrates. Lithium niobate and lithium tantalate are also excellent materials in that their uncompensated temperature coefficient of delay is somewhat less than most other piezoelectric materials commonly used for fabrication of surface acoustic wave devices.

Figure 2:
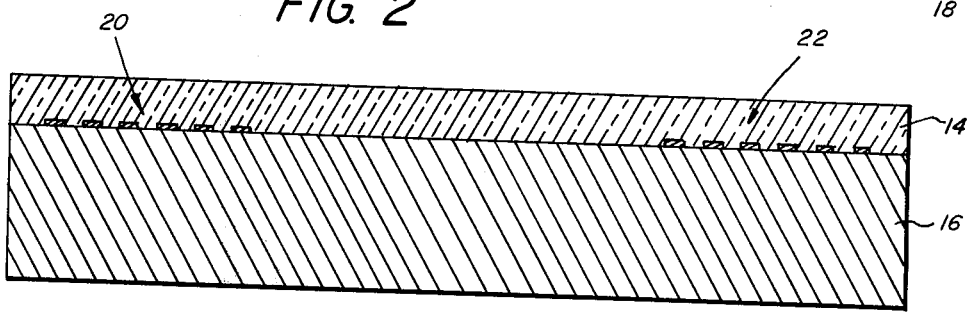
FIG. 2 is a cross-sectional view of the device shown in FIG. 1.

Deposited upon the surface of substrate 16 in contact with both the substrate and the input and output transducers 20 is silicon dioxide layer 14. Lithium niobate, lithium tantalate and the other nonpiezoelectric materials have a positive first order temperature coefficient while that of silicon dioxide is negative. The thickness of silicon dioxide layer 14 relative to the wavelength of acoustic waves traveling upon the surface of substrate 16 determines the overall effect of silicon dioxide layer 14 upon the propagation velocity of the waves. Accordingly, it has been discovered that by judicious choice of the thickness of silicon dioxide layer 14 relative to the acoustic wavelength, the first order temperature coefficient of the device can effectively be cancelled. For reasons explained below, it is preferred that the silicon dioxide layer have a uniform thickness as shown in FIGS. 1 and 2 when lithium tantalate forms the substrate. For the case of lithium niobate, a nonuniform layer is preferred.

Figure 3:
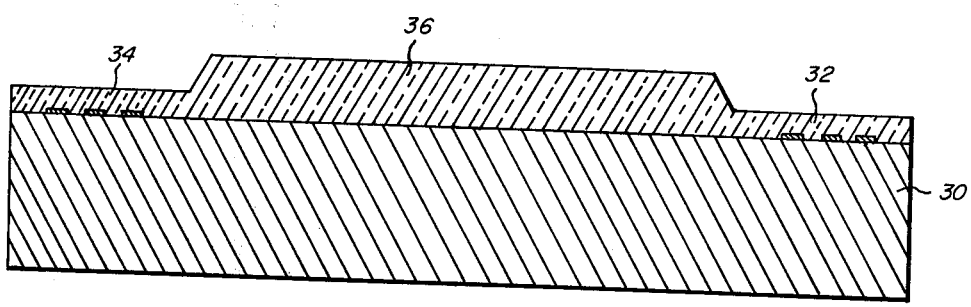
FIG. 3 is a cross-sectional view of a surface acoustic wave device in accordance with the present invention in which, preferably, a lithium niobate substrate is used.
Figure 4:
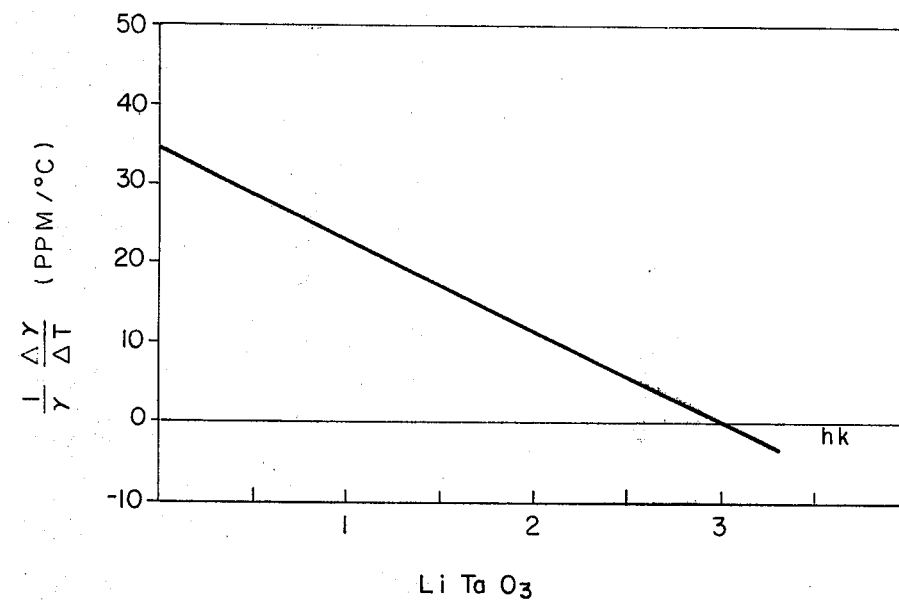
FIG. 4 is a graph of the temperature coefficient versus hK for a lithium tantalate substrate.
Figure 5:
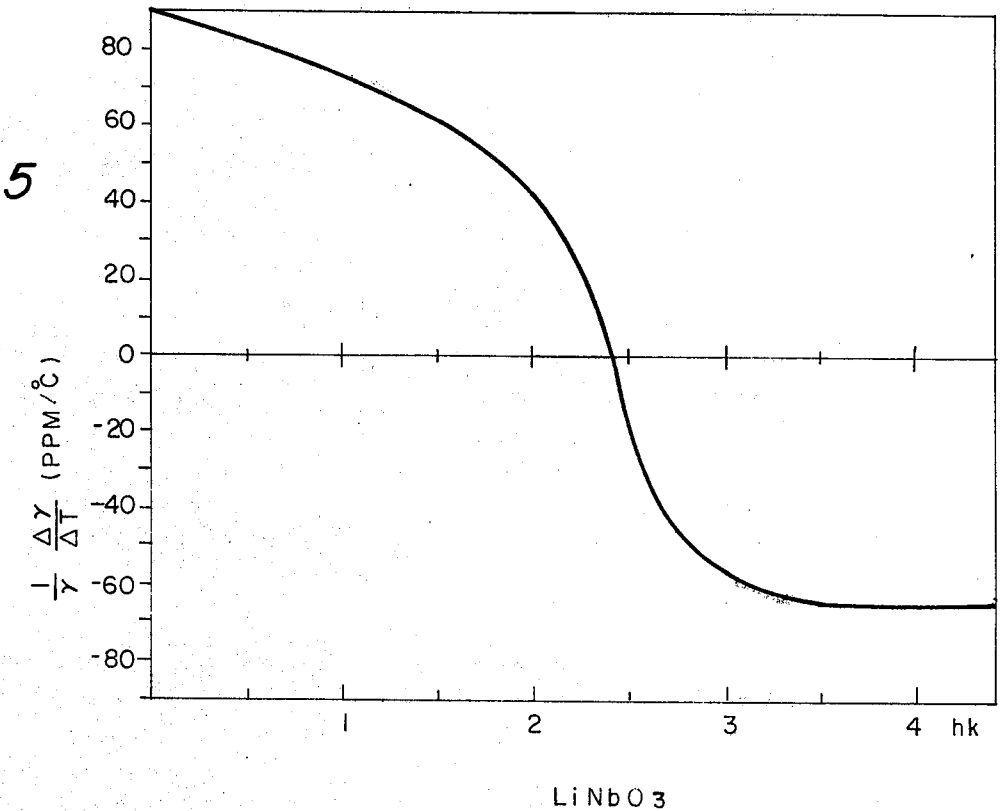
FIG. 5 is a graph of the temperature coefficient versus hK for a lithium niobate substrate.

Experimental graphs of the temperature coefficient of delay versus $hK$ ($h$ = film thickness of the silicon dioxide layer and $K = 2\pi/\lambda$ where $\lambda$ = acoustic wavelength) are shown in FIGS. 4 and 5 for the devices of FIGS. 2 and 3, respectively. The lithium tantalate device, a first order temperature coefficient of zero is obtained when $hK$ is approximately 3. For the lithium niobate device, the zero first order temperature coefficient is obtained when $hK =$ approximately 2.3. Hence, for the case of lithium tantalate, a silicon dioxide layer of thickness approximately $h = 3\lambda/2\pi$  0.5 produces a zero first order temperature coefficient.

For the case of lithium niobate, it has been found experimentally that if a layer of silicon dioxide of constant thickness is used, that a large proportion of the input surface waves leak into the inner portions of the substrate becoming bulk waves so that a large portion of the input acoustic wave energy never reaches the output transducers. It has been found that this problem may be circumvented and the greater portion of the acoustic energy retained if the silicon dioxide layer is deposited having a nonuniform thickness. In the preferred form of the lithium niobate device shown in FIG. 3, the center portion 36 of the silicon dioxide layer has a thickness of approximately 0.7 times the acoustic wavelength and occupies approximately 55% of the linear distance along the surface of substrate 30 between the input and output transducers. Portions 32 and 34 of the silicon dioxide layer covering the input and output transducer have a preferred thickness of 0.1 times the acoustic wavelength. The edges of center portion 36 are tapered to meet portions 32 and 34.

Figure 6:
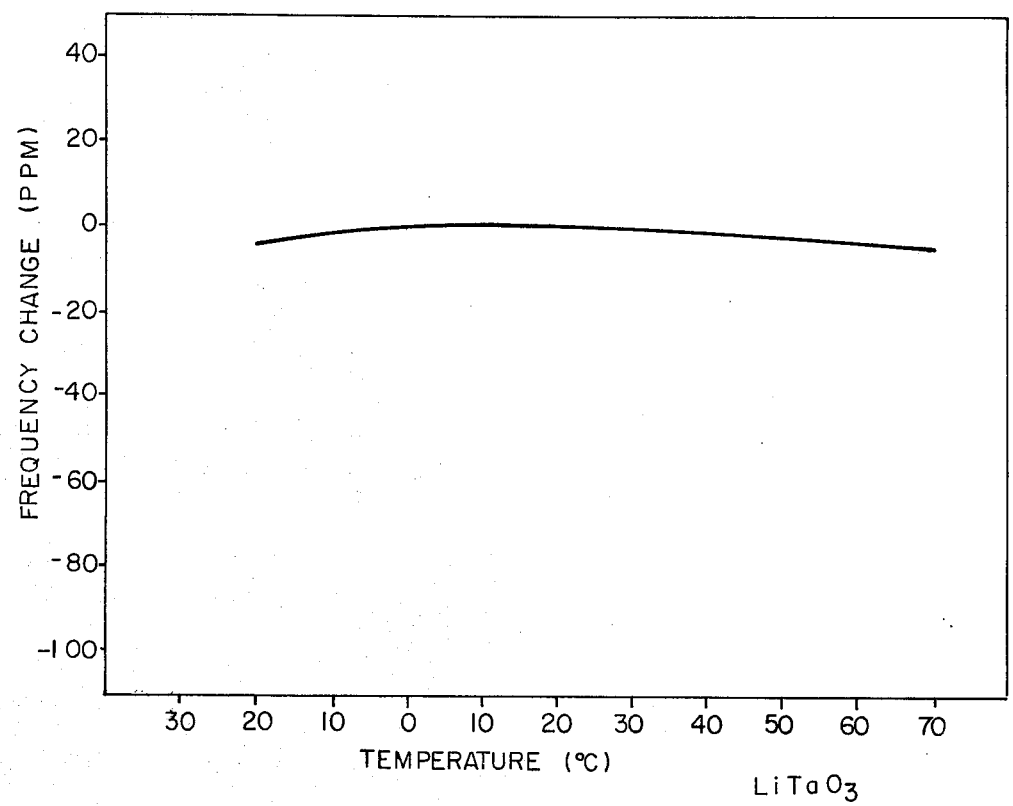
FIG. 6 is a graph of frequency change versus temperature for the lithium tnatalate device.
Figure 7:
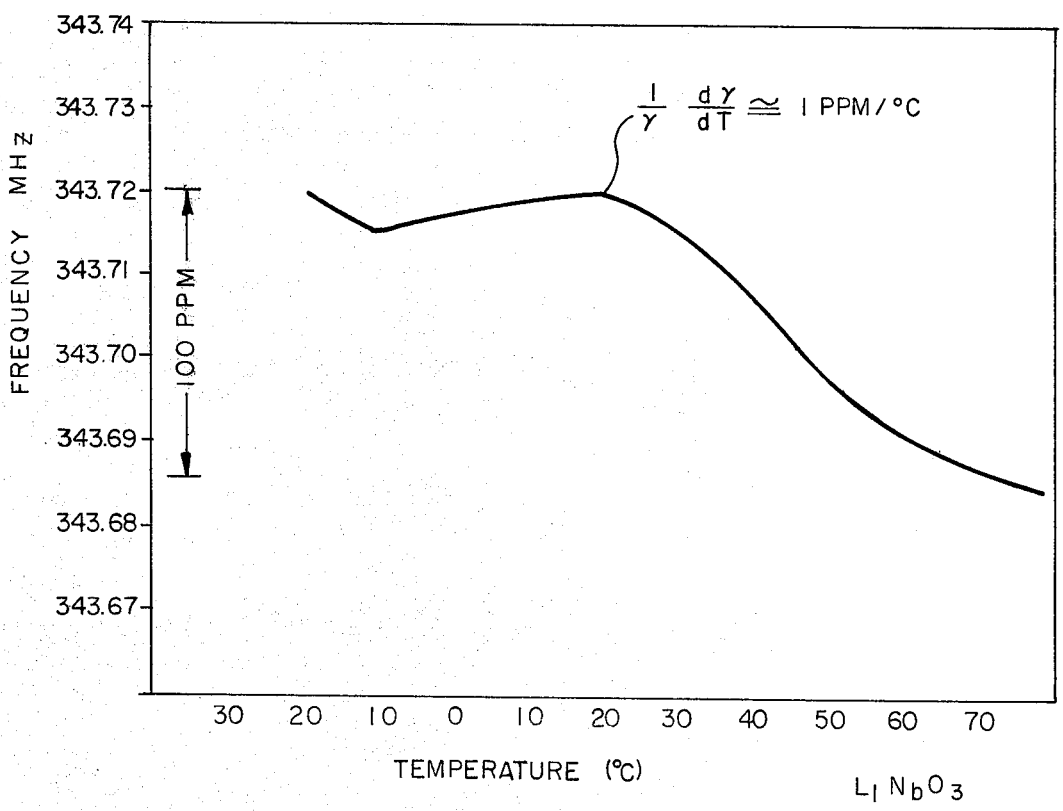
FIG. 7 is a graph of output frequency versus temperature for the device of FIG. 3 used in a phase-locked oscillator loop.

To further verify the low temperature coefficient of surface acoustic wave devices constructed in accordance with the present invention, the devices shown in FIGS. 2 and 3 were coupled into a phased locked oscillator loop. In such a circuit, any change in delay time of the device is reflected in the output frequency of the oscillator circuit. The results are shown in the graphs of FIGS. 6 and 7 for lithium tantalate and lithium niobate, respectively, for the case of an acoustic wavelength of 10.16 $\mu$ for each case. For the lithium tantalate device, the frequency change versus temperature is nearly flat changing by no more than 20 ppm (parts per million) throughout the temperature range of −20°C to +70°C or less than 1 ppm/°C. For the lithium niobate device, where the actual frequency is plotted against temperature along with an indication of the proportional change, the response is nearly flat for −20°C to +25°C with a change of only approximately 1 ppm/°C. These temperature change coefficients are to be contrasted with those of the uncompensated lithium tantalate and lithium niobate which are approximately 35 ppm/°C and 90 ppm/°C, respectively.

Figure 8:
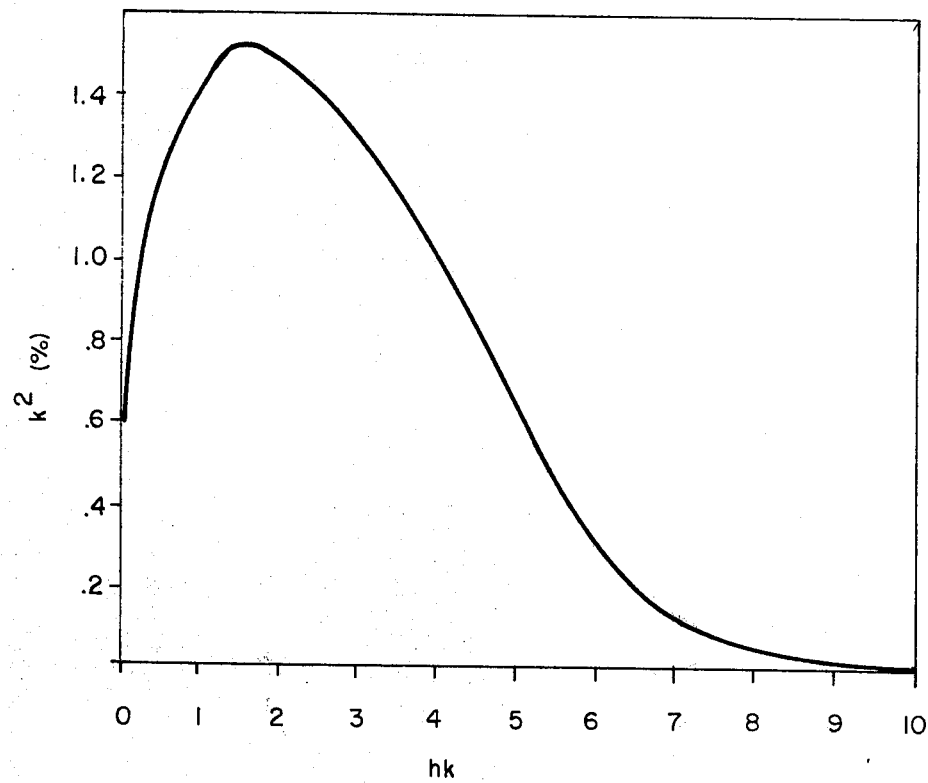
FIG. 8 is a graph of the coupling coefficient $k^2$ versus $hK$ for the lithium tantalate device.

At least for the case of the lithium tantalate device, the coupling coefficient $k^2$ actually is improved with the addition of the silicon dioxide temperature compensating layer. A graph of $k^2$ versus $hK$ is shown in FIG. 8. It may be seen from the graph that in the region of interest of $hK$, the coupling coefficient $k^2$ has increased from approximately 0.7% with no silicon dioxide to approximately 1.2% with $hK = 3$. The coupling coefficient of the lithium niobate device is also high having been experimentally determined to be at least 5.4%.

Figure 9:
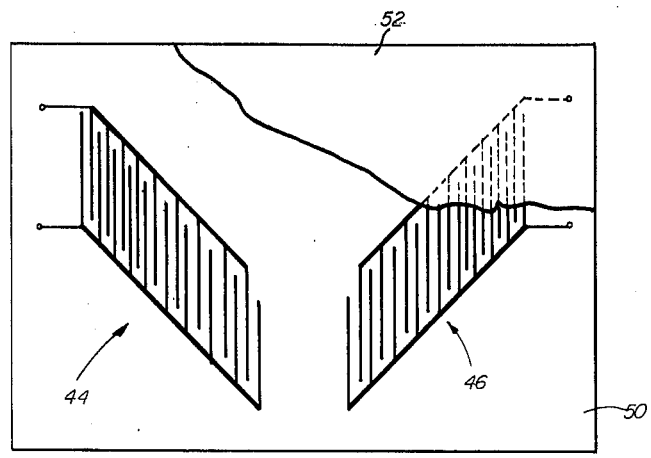
FIG. 9 is a partially cutaway planar view of a tilted transducer dispersive delay line device in which the present invention is used to advantage.

In FIG. 9 is shown a surface wave device 40 constructed in accordance with the present invention for use as a linear dispersive delay line. Input and output transducers 44 and 46, respectively, are tilted symmetrically about the center line of the device. The fingers at the lower end of the figure are spaced further apart than those towards the upper end. The fingers with the larger spacing respond to lower frequencies and the fingers spaced closer together respond to higher frequencies. Because of this geometrical arrangement, waves of lower frequencies have a short distance to travel and hence are delayed less than waves of high frequencies. This effect upon signals passing from input to output transducer is known as dispersion. The center axis of each transducer can be made nonlinear as well to produce nonlinear dispersion as desired.

Silicon dioxide layer 52 overlays input and output transducers 44 and 46, respectively, and the exposed surface of substrate 50. The thickness of silicon dioxide layer 52 is chosen to give the device an overall zero first order temperature coefficient or a minimum overall temperature coefficient.

Figure 10:
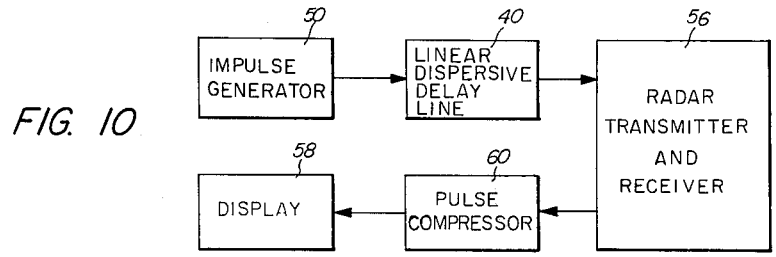
FIG. 10 is a block diagram of a pulse compression radar system embodying the device of FIG. 6.

Extreme temperature stability is required of linear dispersive delay lines used to generate chirped waveforms such as in the simplified block diagram of the radar system shown in FIG. 10. Linear dispersive delay line 40, the same device as shown in FIG. 9, is excited by an impulse waveform from impulse generator 50. This excitation, applied equally to all the fingers of the input transducer, causes output signals to be generated at the output terminals of output transducer 46 at times dependent upon the delay time between different portions of input and output transducers 44 and 46. Since the Fourier transform of the impulse function is a flat frequency response, the output signal will appear as a frequency varying sinusoid with beginning and end frequencies determined by the maximum and minimum finger spacings of the input and output transducers. Delay changes caused by temperature variation result in the shifting in frequency of the components of the output signal.

Many radar systems, such as the one shown in FIG. 10, measure the velocity of radar targets using the Doppler effect which causes a frequency shift of returned signals relative to the frequency or spectrum of frequencies at which they are transmitted. Variations in the frequency spectrum of the input waveform caused by temperature changes appear to the radar system as errors in the measured velocity of the radar targets. A high degree of frequency stability achievable with the present invention minimizes these errors.

The output signals produced by linear dispersive delay line 40 are transmitted by radar transmitter and receiver 56 reflected off the varying targets, received, then coupled to pulse compressor 60 for conversion back to impulse form. Pulse compressor 60 may be constructed as linear dispersive delay line 40 using the present invention but with the fingers having the closest spacing at the bottom of the transducer and the fingers at the top having the greatest spacing. The reconstructed impulses are coupled to delay 58 for observance by the radar operators.

Figure 11:
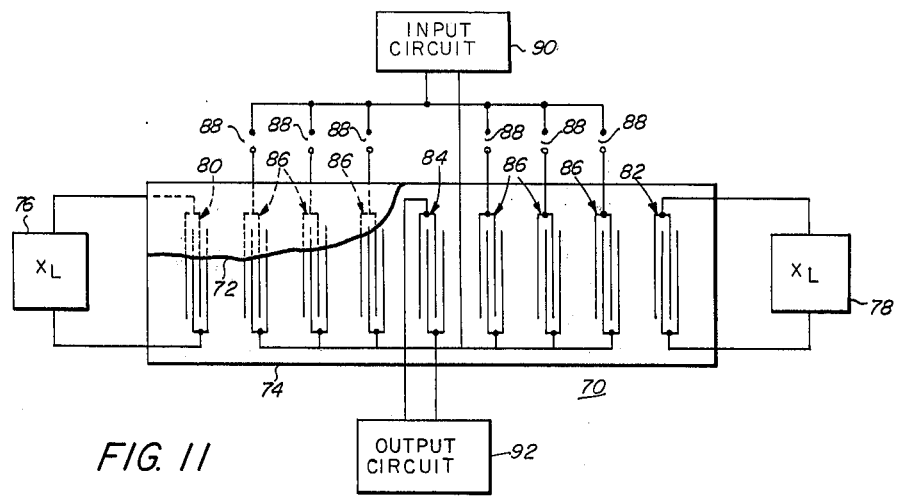
FIG. 11 is a partially cutaway planar view of a surface acoustic wave filter having switchable taps in which the present invention is used to advantage.

In FIG. 11 is shown a surface acoustic wave filter device in which the present invention is used to advantage. Such devices, exclusive of the use of the present invention, are shown and claimed in U.S. Pat. No. 3,831,116 to Davis, Jr., et al. and assigned to the present assignee, the specification of that patent being incorporated herein by reference. At each end of piezoelectric substrate 74 are located terminal transducers 80 and 82 terminated in the negative of the reactive portion of their impedances so that they reflect surface waves reaching the ends of the device. Input transuders 86 are selectively coupled to input circuit 90 by external switches 88. Output transducer 84, located in the approximate center of the device, is coupled to an external output circuit 92. As described in the referenced patent, the frequency of the signals permitted to pass between input and output circuits is determined by the spacing between transducers, the length of the transducer fingers, and the selection of transducers coupled to the input circuit. The relative positions of the input and output circuits may be reversed while retaining the same frequency response of the device.

Figure 12:
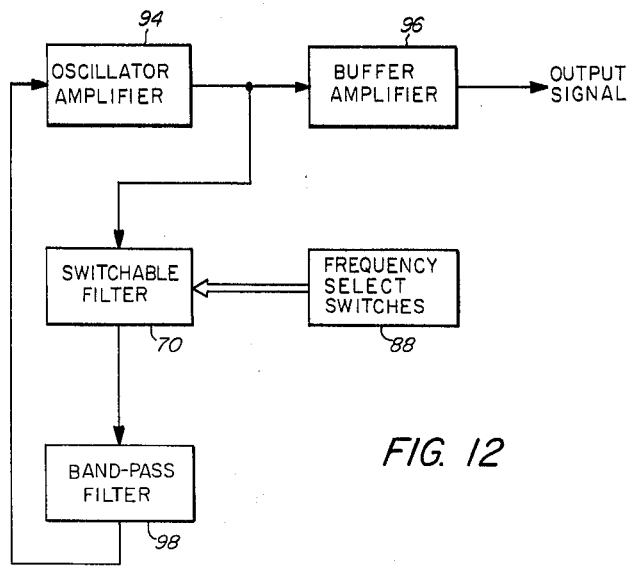
FIG. 12 is a block diagram of an oscillator circuit employing the device of FIG. 8.

Such a switchable filter may be used in the oscillator circuit of FIG. 12 having a switchably selective output frequency. Switchable filter 70 and frequency select switches 88 are coupled in a feedback loop with oscillator amplifier 94 and bandpass filter 98. The gain of oscillator amplifier 94 is set sufficiently high such that the loop oscillates. Bandpass filter 98 removes any unwanted components of the oscillating signal. Buffer amplifier 96 provides isolation and amplification for the final output signal. Such a frequency selective oscillator is useful in two-way radio operation where it is desired to be able to quickly switch from one operating frequency to the other. Stringent frequency stability criteria are set by law for such radios. Use of silicon dioxide layer 72 over substrate 74, tranducers 80, 82, 84 and 86 wherein the thickness of silicon dioxide layer 72 is selected for zero first order temperature coefficient in accordance with the invention makes such a device acceptable for many of the frequency stability criteria imposed.

Many other configurations can be used for oscillator applications. In one such configuration, a substrate of piezoelectric material has input and output transducers located at opposite ends of a surface of the substrate. Between the transducers are two sets of gratings made by etching grooves into the substrate perpendicular to the direction of propagation of waves traveling upon the surface. The grooves of each set are spaced one-half wavelength apart at the oscillator frequency and a one-quarter wavelength space is left in the center between the two sets of transducers. A layer of silicon dioxide is deposited over the transducers, gratings, and surface of the piezoelectric substrate in accordance with the present invention. The input transducer is coupled to the output of an amplifier while the output transducer is coupled to the input of the same amplifier thereby forming a closed loop. Upon activation of the amplifier standing waves are set up in each set of gratings with acoustic coupling between gratings and transducers. With the thickness of the silicon dioxide layer determined in accordance with the present invention the oscillator circuit will be extremely temperature stable. Many oscillators which previously required temperature controlled ovens can with the invention be operated without such devices.

Figure 13:
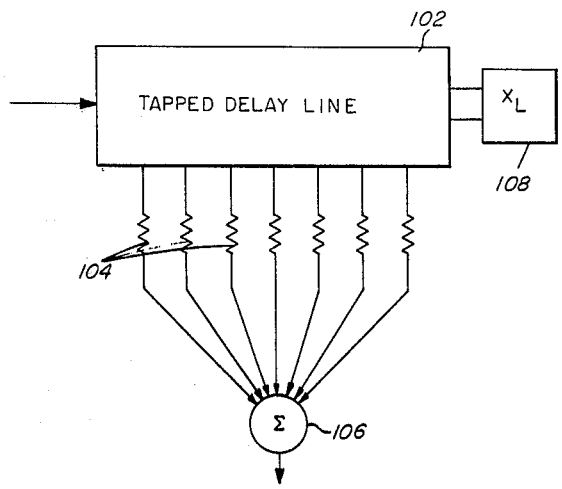
FIG. 13 is a block diagram of a portion of a communications system employing a tapped delay line in which the present invention is used to advantage.

In FIG. 13 is shown an application of the invention in tapped delay line 102 used in signal processing circuitry of a communications system. The tapped delay line is constructed with a single input transducer at one end of a piezoelectric substrate with multiple transducer taps spaced along the length of the substrate. At the terminal end of the delay line 102, the final transducer is coupled to output load 108 which, as in the device of FIG. 11, terminates the output transducer in its characteristic impedance causing it to absorb all surface waves reaching the terminal end and thereby preventing reflections back towards the input end of the device. In the applications shown in FIG. 13, the output of each of the taps is coupled to weighting resistor 104, the outputs of which are coupled to summer circuit 106. In this class of communication signal processing applications, the phase difference between signal outputs from each tap must be maintained to a high degree of accuracy. Shifting or changes of the phase differences between taps destroys the device's usefulness. Use of the present invention permits the high degree of temperature stability required in many such present day signal processing applications in communications systems.

The devices described above can be fabricated by first depositing the interdigital transducers on a piezoelectric substrate of lithium niobate or lithium tantalate using standard photolithography techniques. Aluminum is the preferred material for the transducers. The layer of silicon dioxide is then deposited over the substrate and transducers. RF sputtering from a fused silica target at a temperature of approximately 150°C at a rate of between 2,000 and 10,000A/hour in a pure oxygen atmosphere has been found satisfactory for the deposition process.

Although preferred embodiments of the invention have been described, numerous modifications and alterations thereto would be apparent to one skilled in the art without departing from the spirit and scope of the present invention.

What is claimed is:

1. In combination:
a substrate of lithium tantalate piezoelectric material; and
a layer of silicon dioxide disposed upon a surface of said substrate, the thickness of said layer being determined such that the temperature coefficient of delay for surface waves on said substrate is within a predetermined range of values.

2. The combination of claim 1 wherein the thickness of said layer is varied over the surface of said substrate.

3. The combination of claim 1 wherein the thickness of said layer is substantially constant over the surface of said substrate.

4. The combination of claim 1 further comprising transducer means coupled to said surface of said substrate.

5. The combination of claim 4 wherein the first order temperature coefficient of delay is substantially zero.

6. A surface acoustic wave device comprising in combination:
a substrate of lithium tantalate;
one or more transducer means coupled to said substrate upon a surface thereof; and
a layer of silicon dioxide disposed upon said surface of said substrate, the thickness of said layer being determined such that the temperature coefficient of delay for surface waves on said substrate is a minimum.

7. The combination of claim 6 wherein said layer covers said transducer means.

8. The combination of claim 6 wherein the thickness of said layer is substantially uniform.

9. The combination of claim 6 wherein the thickness of said layer is approximately one-half the wavelength of said surface waves.

10. A surface acoustic wave device comprising in combination:
a substrate of lithium niobate;
one or more transducer means coupled to said substrate upon a surface thereof; and
a layer of silicon dioxide disposed upon said surface of said substrate, the thickness of said layer being determined such that the temperature coefficient of delay for surface waves on said substrate is a minimum.

11. The combination of claim 10 wherein a portion of said layer covers said transducer means.

12. The combination of claim 11 wherein a second portion of said layer has a greater thickness than said first portion.

13. The combination of claim 12 wherein said second portion of said layer covers approximately 55% of the length of said substrate.

14. The combination of claim 13 wherein the thickness of said first portion of said layer is approximately one-tenth the wavelength of said surface waves and the thickness of said second portion of said layer is approximately seven-tenths the wavelength of said surface waves.

15. In combination:
a substrate of piezoelectric material;
input and output transducer means coupled to a surface of said substrate, said input and output transducer means each comprising a plurality of interleaved conductive fingers, the propagation time of surface waves between said input and output transducer means being dependent upon the frequency of said waves;
a layer of silicon dioxide covering said surface and said transducer means, the thickness of said layer being determined such that the temperature coefficient of delay of said surface waves is a minimum.

16. The combination of claim 15 further comprising utilization means in a pulse compression radar system.

17. The combination of claim 16 wherein said substrate comprises lithium niobate.

18. The combination of claim 16 wherein said substrate comprises lithium tantalate.

19. In combination:
a substrate of piezoelectric material;
means for reflecting surface waves, said reflecting means being located upon a surface of said substrate;
a plurality of input and output transducer means coupled to said surface and located between said reflecting means; and
a layer of silicon dioxide covering said surface, said reflecting means, and said transducer means, the thickness of said layer being determined such that the temperature coefficient of delay of said surface waves is a minimum.

20. The combination of claim 19 further comprising means for selectively coupling said input and/or output transducer means to utilization means in an oscillator circuit.

21. The combination of claim 20 wherein said substrate comprises lithium niobate.

22. The combination of claim 20 wherein said substrate comprises lithium tantalate.

23. The method comprising the steps of:
providing a substrate of piezoelectric material;
fabricating one or more transducer means upon a surface of said substrate depositing a layer of silicon dioxide over said surface of said substrate and said transducer means, the thickness of said layer being determined such that the temperature coefficient of delay for acoustic waves on said surface is a minimum.

24. The method of claim 23 wherein said substrate comprises lithium niobate.

25. The method of claim 23 wherein said substrate comprises lithium tantalate.

26. The method of claim 23 wherein said depositing comprises RF sputtering from a fused silica target.

27. The method of claim 26 wherein said sputtering is done at a temperature of approximately 150°C in an atmosphere of substantially pure oxygen.

28. The method of claim 27 wherein said sputtering is done at a rate of between 2,000 and 10,000 A/hour.

29. An oscillator comprising in combination:
a substrate of piezoelectric material;
a plurality of transducer means coupled to a surface of said substrate;
a layer of silicon dioxide covering said surface and said transducer means, the thickness of said layer being determined such that the temperature coefficient of delay of surface waves upon said substrate is a minimum; and
amplifying means, inputs of said amplifying means being coupled to one or more of said transducer means and outputs of said amplifying means being coupled to one or more other ones of said transducer means.

30. The combination of claim 29 wherein said substrate comprises lithium tantalate.

31. The combination of claim 29 further comprising a plurality of gratings upon said surface disposed between at least some of said transducer means.

32. In combination:
a substrate of piezoelectric material; and
a layer of silicon dioxide disposed upon a surface of said substrate, the thickness of said layer being determined such that the first order temperature coefficient of delay for surface waves on said substrate is substantially zero.

33. The combination of claim 32 wherein the thickness of said layer is varied over the surface of said substrate.

34. The combination of claim 32 wherein the thickness of said layer is substantially constant over the surface of said substrate.

35. The combination of claim 32 further comprising transducer means coupled to said surface of said substrate.

36. In combination:
a substrate of lithium niobate piezoelectric material; and
a layer of silicon dioxide disposed upon a surface of said substrate, the thickness of said layer being determined such that the first order temperature coefficient of delay for surface waves on said substrate is substantially zero.

37. The combination of claim 36 wherein the thickness of said layer is varied over the surface of said substrate.

38. The combination of claim 36 wherein the thickness of said layer is substantially constant over the surface of said substrate.

39. The combination of claim 36 further comprising transducer means coupled to said surface of said substrate.

* * * * *